United States Patent [19]

Gurnee

[11] 4,021,833
[45] May 3, 1977

[54] INFRARED PHOTODIODE
[75] Inventor: Mark N. Gurnee, Fridley, Minn.
[73] Assignee: Honeywell Inc., Minneapolis, Minn.
[22] Filed: May 17, 1976
[21] Appl. No.: 687,056
[52] U.S. Cl. .................................... 357/15; 357/16; 357/30; 357/61
[51] Int. Cl.² ................. H01L 29/48; H01L 27/14
[58] Field of Search .................. 357/16, 15, 30, 61

[56] References Cited
UNITED STATES PATENTS

| | | | |
|---|---|---|---|
| 3,716,424 | 2/1973 | Schovlar | 148/175 |
| 3,748,593 | 7/1973 | Dimmock | 331/94.5 M |
| 3,911,469 | 10/1975 | Wrobel | 357/30 |
| 3,961,998 | 4/1975 | Scharnhorst | 148/175 |
| 3,980,915 | 9/1976 | Chapman | 313/101 |

OTHER PUBLICATIONS

Walpole et al., *Appl. Phys. Lett.*, vol. 23, No. 11, Dec. 1, 1973, pp. 620–622.

Primary Examiner—Martin H. Edlow
Attorney, Agent, or Firm—Henry L. Hanson; Charles J. Ungemach

[57] ABSTRACT

An improved lead tin telluride Schottky barrier photodiode includes a lead telluride — lead tin telluride heterojunction structure to increase zero bias resistance.

9 Claims, 5 Drawing Figures

INFRARED PHOTODIODE

BACKGROUND OF THE INVENTION

The present invention relates to photodetectors. In particular, the present invention relates to improved infrared sensitive Schottky barrier photodiodes.

In recent years, lead tin telluride and lead tin selenide have been developed as potential infrared detector materials for the important 8 − 14 micron wavelength region. The energy gap or bandgap of these materials may be varied by varying the ratio of lead, tin, selenium, and tellurium in the materials.

Schottky barriers have been used to fabricate infrared detectors on lead tin telluride and on lead telluride, using a barrier forming material such as lead, indium, and others. Similar Schottky barriers may be formed on lead tin selenide.

One problem which has been encountered with Schottky barrier infrared detectors for the 8 − 14 micron radiation region has been the low zero bias resistance of the detectors. The resistance of the detector is lower than that necessary for optimum detector performance.

SUMMARY OF THE INVENTION

The present invention is a Schottky barrier infrared detector which has increased zero bias resistance over the prior art Schottky barrier infrared detectors. The infrared sensitive photodiode of the present invention includes a body of a first semiconductor material $Pb_{1-x}Sn_xTe_{1-y}Se_y$, where $0 \leq x \leq 1$ and $0 \leq y \leq 1$. A thin layer of a second semiconductor material of the same carrier type is on at least a portion of a surface of the body. The second semiconductor material has a wider bandgap than the first semiconductor material. A Schottky barrier metal is attached to the thin layer.

DETAILED DESCRIPTION OF THE PREFERRED EMBODIMENTS

Figure 1:
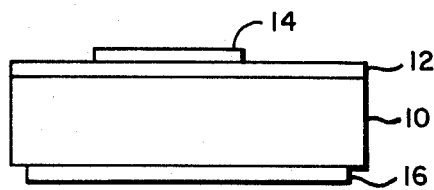
FIG. 1 shows a Schottky barrier infrared photodiode of the present invention.

FIG. 1 shows the infrared photodiode of the present invention. The photodiode includes a body 10 of a first semiconductor material, a thin layer 12 of a second, wider bandgap semiconductor material, a metal contact 14 which forms a Schottky barrier with thin layer 12, and a metal contact 16 which forms ohmic contact with body 10. A photosignal may be derived from contacts 14 and 16.

In the present invention, the body 10 is of a first semiconductor material of the group including lead tin telluride, lead tin selenide, and mixtures of these materials. This group may be designated by the chemical formula $Pb_{1-x}Sn_xTe_{1-y}Se_y$, where $0 \leq x \leq 1$ and $0 \leq y \leq 1$. In the preferred embodiments, the first semiconductor material has a bandgap which allows it to be sensitive to radiation within the 8 − 14 micron wavelength region.

The thin layer 12 may be any semiconductor material which has a larger bandgap than the first semiconductor material. In order to insure maximum compatibility between body 10 and thin layer 12, the preferred second semiconductor material is $Pb_{1-x'}Sn_{x'}Te_{1-y'}Se_{y'}$, where $x > x' \geq 0$ and/or $> y' \geq 0$. In many embodiments, PbTe is the preferred second semiconductor material. The thickness of the thin layer is such that the heterojunction formed by the body 10 and thin layer 12 is within the depletion region associated with the Schottky barrier. When PbTe is the second semiconductor material, the thickess of thin layer 12 is in the range of about 200 A to about 2,000 A.

Thin layer 12 may be fabricated by a number of well known techniques. These include evaporation, molecular beam epitaxy, and liquid phase epitaxy.

In the preferred embodiments, body 10 and thin layer 12 have the same conductivity type. Schottky barriers are readily fabricated on p-type lead telluride and lead tin telluride using barrier forming metals such as lead, indium, and others. In the preferred embodiments, therefore, both body 10 and thin layer 12 have p-type conductivity. Improved performance, however, can also be obtained when both 10 and thin layer 12 have n-type conductivity.

FIGS. 2 through 5 show the band structure of various Schottky barrier photodiodes, including the photodiode of the present invention. For ease of discussion, the present invention will be described with a p-type lead tin telluride body 10 and a p-type lead telluride thin layer 12. It is understood, however, that other materials may be used for body 10 and thin layer 12 in accordance with the present invention.

A common criterion for the operation of a photovoltaic infrared detector is the product of the zero bias resistance of the detector times its area, RA. A large RA product is necessary for high sensitivity photovoltaic infrared detectors.

The current which determine the detector zero bias resistance are diffusion current flow over the barrier, tunneling current through the barrier, and generation and recombination currents from within the depletion region. An increase of the Schottky barrier height by using a thin surface layer of semiconductor with a larger bandgap than the bulk semiconductor will cause a decrease in all three components of detector current, and hence raise the zero bias resistance and detector performance.

The diffusion current component is reduced because of the increased barrier height combined with an increase of barrier effective thickness to tunneling for a given hole energy in the valence band. The generation-recombination current is reduced because of the decrease in intrinsic carrier concentration in the depletion region, due to the use of a wider bandgap material between the Schottky contact and the bulk semiconductor.

Figure 2:
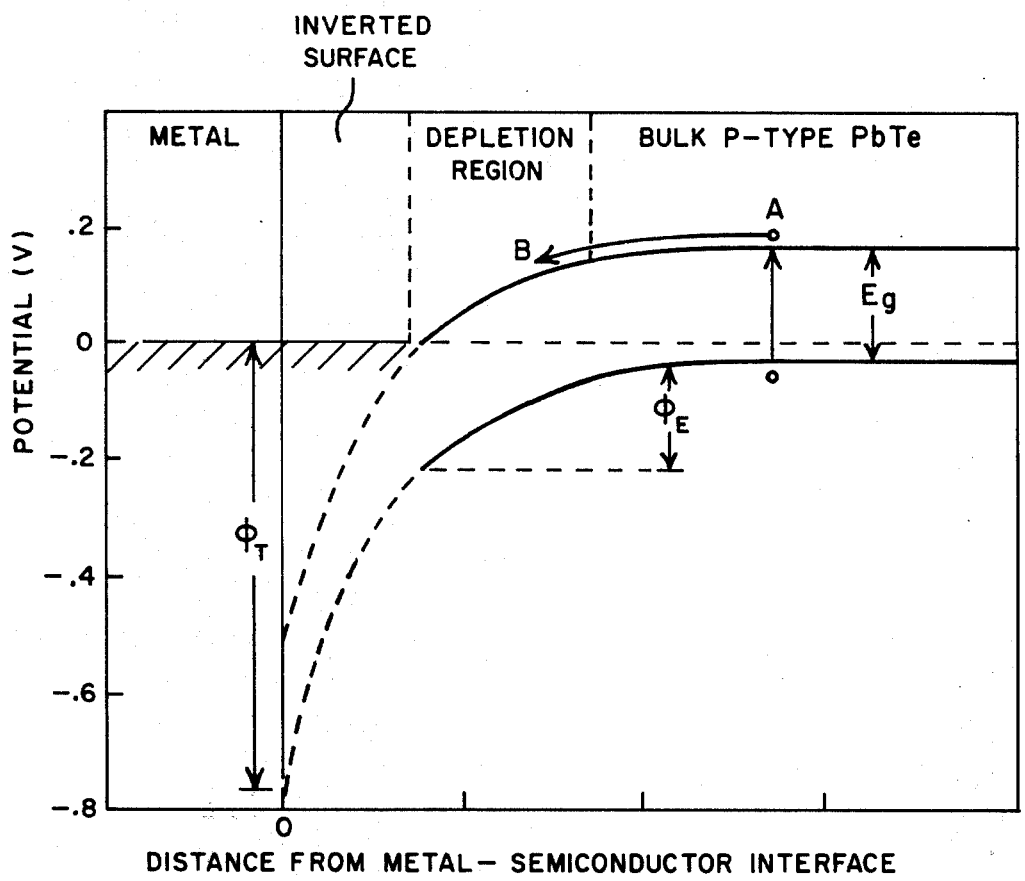
FIG. 2 shows the band structure of a Schottky barrier on p-type PbTe.

FIG. 2 shows the band structure of a Schottky barrier on p-type lead telluride. The theoretical barrier height is given by $\phi_T = X + E_g - \phi_m \approx 0.82$ eV for lead on lead telluride at 77° K. The measured effective barrier height, however, is much lower than this value, usually about $\phi_E = 0.2$ eV.

The low measured barrier height $\phi_E$ (about equal to the energy gap $E_g$ of lead telluride) is thought to be due to the large curvature of the energy bands near the Schottky barrier. Holes with a kinetic energy greater than about $E_g$ see a very narrow energy gap, and find the remainder of the barrier nearly transparent due to tunneling.

Figure 3:
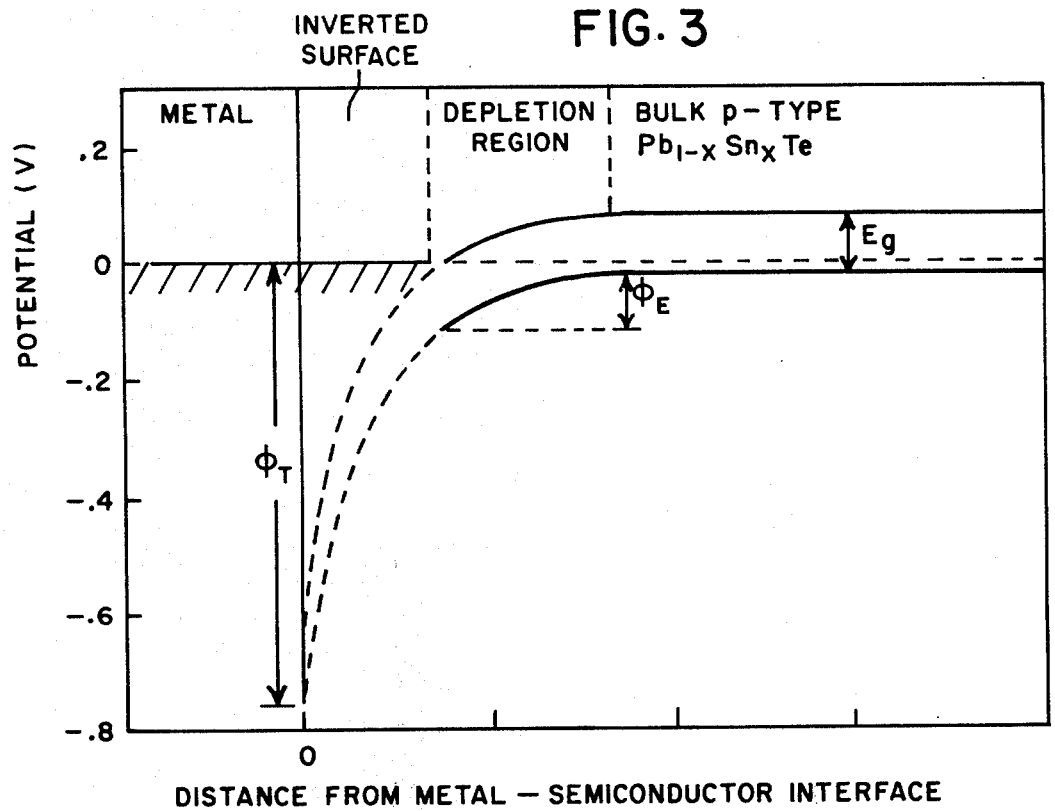
FIG. 3 shows the band structure of a Schottky barrier on p-type $Pb_{1-x}Sn_xTe$.

For Schottky barrier detectors made on lead telluride, the reduced barrier height is not serious, since $\phi_E$ is still large enough to give high resistance photodiodes. For Schottky barriers made on lead tin telluride for 8 – 14 micron detectors, however, the barrier height is much lower due to the smaller energy gap $E_g$ of lead tin telluride. FIG. 3 shows the band structure of a Schottky barrier lead tin telluride photodiode. The resistance of the detector is lower than that necessary for optimum detector performance because of the small $E_g$ and $\phi_E$.

In addition there is a current contribution due to the generation-recombination mechanism which acts to further reduce the detector resistance.

Figure 4:
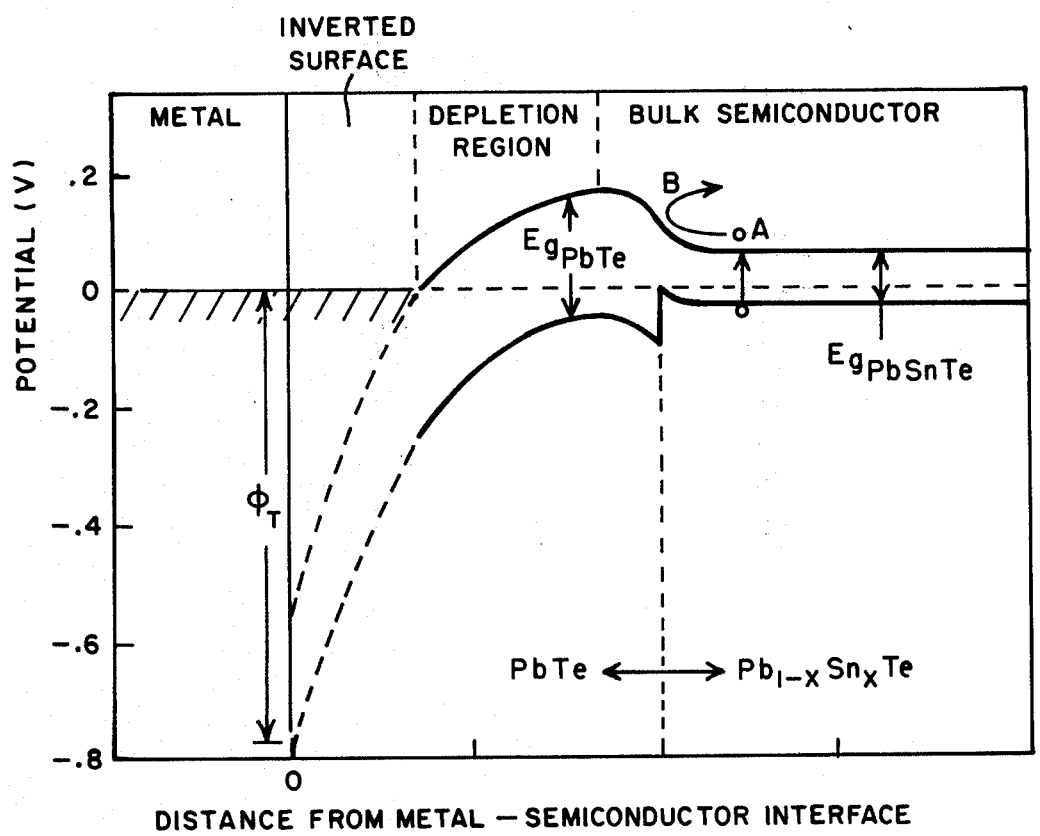
FIG. 4 shows the band structure of a Schottky barrier photodiode having a PbTe - $Pb_{1-x}Sn_xTe$ heterojunction which is outside the depletion region associated with the Schottky barrier.
Figure 5:
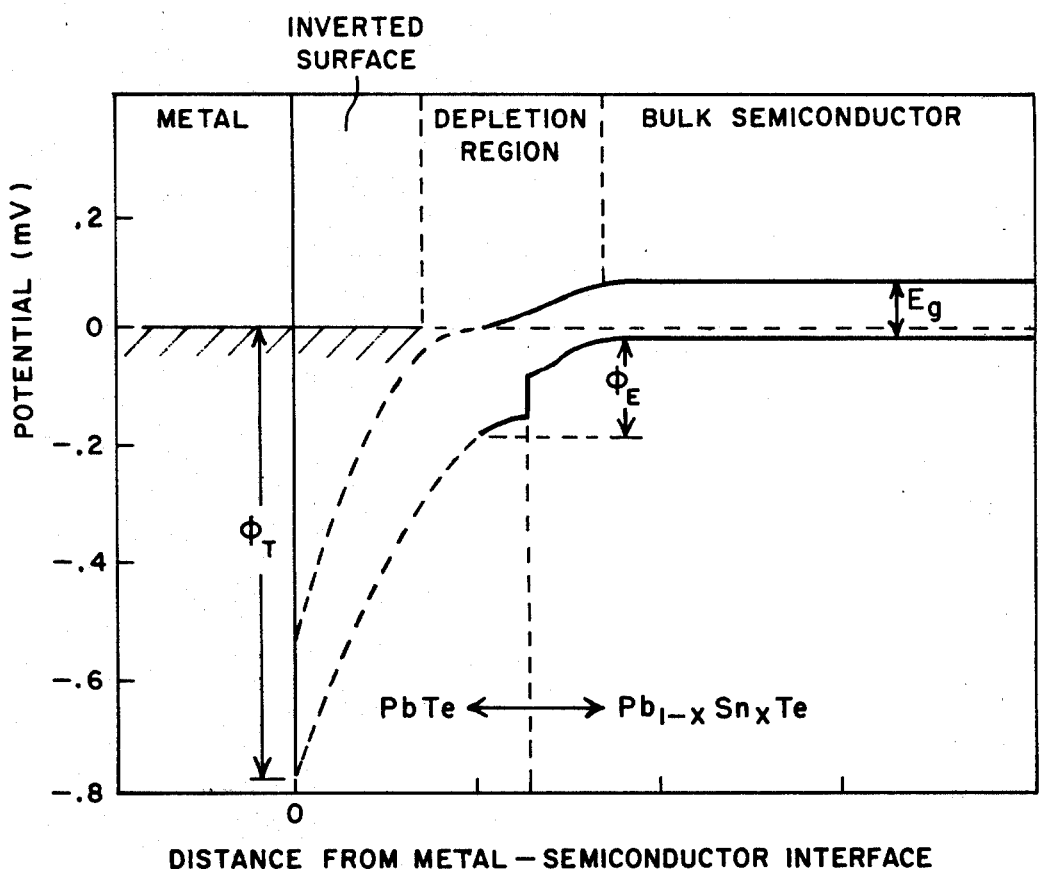
FIG. 5 shows the band structure for a Schottky barrier photodiode having a PbTe - $Pb_{1-x}Sn_xTe$ heterojunction within the depletion region associated with the Schottky barrier.

The present invention involves the use of a heterojunction structure which increases the effective barrier height, and reduces the intrinsic carrier concentration in the depletion region, thereby increasing the detector resistance and hence its detectivity. In the preferred embodiment, a p-type lead tin telluride — p-type lead tin telluride heterojunction is formed. A Schottky barrier is then formed to the p-type lead telluride. It is important that the lead telluride layer be thin enough that the heterojunction is within the depletion region of the Schottky barrier. FIGS. 4 and 5 illustrate a heterojunction outside and within the depletion region, respectively.

Light of energy greater than the bandgap in a semiconductor liberates electrons and holes. Those minority carriers (electrons) which reach the junction, or depletion region, are collected by the built-in electric field, and generate a current or voltage which is the detector's response to light. For a lead telluride Schottky detector, this effect is shown in FIG. 2. Light with wavelengths shorter than 5.5 microns ($= hc/E_g$) generates a hole-electron pair at A. The electron diffuses to the junction at B and is swept out to the external contacts.

For the case of the heterojunction beyond the Schottky barrier depletion (FIG. 4), the detector performance is severely limited by the existence of the jump in the conduction band at B. Electrons are generated in the lead tin telluride (for example, at A) by light with wavelengths between 5.5 and 14 microns (the light to which the detector is sensitive). As these electrons try to diffuse to the junction to be collected, however, they hit the barrier at B and are repelled back into the lead tin telluride and are not available as an external current. For the case shown in FIG. 4, therefore, there is little sensitivity to 5.5 – 14 microns radiation.

On the other hand, for the structure in FIG. 5, the jump in the conduction band is counteracted by the band bending of the Schottky barrier depletion region. There is no net electron barrier between the lead tin telluride and the junction, and all electrons excited by the 5.5 microns to 14 micron light can reach the junction.

In the region where the bands start to curve strongly, the tunneling region is wider for the heterojunction structure because of the larger bandgap of the lead telluride compared to the lead tin telluride. This may be determined by a comparison of FIG. 3 with FIG. 5. It can be seen that the barrier height is larger for a given width of forbidden bandgap in the heterojunction than for the lead tin telluride alone. The resistance of the heterojunction Schottky barrier detector due to tunneling at the effective barrier top, therefore, is higher than that of the lead tin telluride detector.

It may also be seen from FIG. 5 that most of the depletion region falls across the wider bandgap semiconductor. The lower intrinsic carrier concentration in the wide bandgap material gives a lower contribution from generation-recombination current to the total detector current than in the case of a single material Schottky barrier detector, thereby allowing a higher detector resistance to be achieved.

The heterojunction — Schottky barrier structure of the present invention has a good collection efficiency, a higher barrier than Schottky barrier on lead tin telluride, a lower generation-recombination contribution to detector current, and, therefore, a higher resistance. This improves performance at a given temperature or allows higher temperature operation.

Although the present invention has been described with reference to a series of preferred embodiments, workers skilled in the art will recognize that changes may be made in form and detail without departing from the spirit and scope of the invention.

The embodiments of the invention in which an exclusive property or right is claimed are defined as follows:

1. An infrared sensitive photodiode comprising:
    a body of a first semiconductor material, $Pb_{1-x}Sn_x Te_{1-y}Se_y$, where $0 \le x \le 1$ and $0 \le y \le 1$;
    a thin layer of a second semiconductor material on at least a portion of a surface of the body, forming a heterojunction to the body of the first semiconductor material, the second semiconductor material having a wider bandgap than the first semiconductor material; and
    Schottky barrier means attached to the thin layer, wherein the heterojunction is within a depletion region associated with Schottky barrier means.

2. The infrared sensitive photodiode of claim 1 wherein the second semiconductor material is $Pb_{1-x'}Sn_{x'}Te_{1-y'}Se_{y'}$, where $x > x' \ge 0$ and/or $y > y' \ge 0$.

3. The infrared sensitive photodiode of claim 2 wherein the thin layer has a thickness of between about 200 A and about 2,000 A.

4. The infrared sensitive photodiode of claim 3 wherein the second semiconductor material is PbTe.

5. The infrared sensitive photodiode of claim 4 wherein the first material has p-type conductivity.

6. The infrared sensitive photodiode of claim 5 wherein the second material has p-type conductivity.

7. The infrared sensitive photodiode of claim 6 wherein the Schottky barrier means comprises a contact of a metal from the group consisting of lead and indium.

8. The infrared sensitive photodiode of claim 1 wherein the thin layer has a lower intrinsic carrier concentration than the body.

9. The infrared sensitive photodiode of claim 1 wherein the first and second semiconductor materials have the same conductivity type.

* * * * *